(12) United States Patent
Ning

(10) Patent No.: US 11,893,282 B2
(45) Date of Patent: Feb. 6, 2024

(54) MEMORY SYSTEM

(71) Applicant: CHANGXIN MEMORY TECHNOLOGIES, INC., Hefei (CN)

(72) Inventor: Shu-Liang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 159 days.

(21) Appl. No.: 17/662,423

(22) Filed: May 7, 2022

(65) Prior Publication Data
US 2023/0176784 A1 Jun. 8, 2023

(30) Foreign Application Priority Data

Dec. 8, 2021 (CN) .......................... 202111493134.8

(51) Int. Cl.
| | |
|---|---|
| *G06F 3/06* | (2006.01) |
| *G11C 7/10* | (2006.01) |
| *G11C 11/4076* | (2006.01) |
| *G11C 11/4093* | (2006.01) |

(52) U.S. Cl.
CPC .......... *G06F 3/0659* (2013.01); *G06F 3/0604* (2013.01); *G06F 3/0673* (2013.01); *G11C 7/1063* (2013.01); *G11C 11/4076* (2013.01); *G11C 11/4093* (2013.01)

(58) Field of Classification Search
CPC .... G06F 3/0604; G06F 3/0659; G06F 3/0673; G11C 11/4076; G11C 11/4093; G11C 2207/2254; G11C 5/04; G11C 7/1063; G11C 7/1066; G11C 7/1093; Y02D 10/00
See application file for complete search history.

(56) References Cited

U.S. PATENT DOCUMENTS

| | | | |
|---|---|---|---|
| 7,362,129 B1 * | 4/2008 | Rahman ........... | H03K 19/00384 326/26 |
| 2007/0120583 A1 * | 5/2007 | Lam ...................... | H03L 7/0802 327/156 |
| 2021/0091760 A1 * | 3/2021 | Krishnamurthy ..... | G06F 30/398 |

FOREIGN PATENT DOCUMENTS

CN      112947669 A      6/2021

* cited by examiner

*Primary Examiner* — Terrell S Johnson
(74) *Attorney, Agent, or Firm* — Syncoda LLC; Feng Ma

(57) ABSTRACT

A memory system includes: a plurality of memory chips, wherein each of the memory chips has a parameter used to characterize a process corner of the memory chip; and a controller, wherein the controller is configured to: obtain the parameter of each of the memory chips, and adjust, based on the parameter, a delay of a read command sent to the memory chip corresponding to the parameter.

15 Claims, 4 Drawing Sheets

MEMORY SYSTEM

CROSS-REFERENCE TO RELATED APPLICATION

This application claims priority to Chinese Patent Application No. 202111493134.8, filed on Dec. 8, 2021, the disclosure of which is hereby incorporated by reference in its entirety.

BACKGROUND

Semiconductor memories may be classified into non-volatile memories and volatile memories. A dynamic random-access memory (DRAM), as a volatile memory, has advantages of a high storage density and a fast read and write speed, and is widely used in various electronic systems.

A DRAM system usually includes a controller and a plurality of memory chips. Performance of different memory chips varies with manufacturing processes and other differences. This affects the overall performance of the DRAM system.

SUMMARY

Embodiments of the present disclosure relate to the technical field of semiconductors, and in particular to a memory system.

According to some embodiments of the present disclosure, a first aspect of the embodiments of the present disclosure provide a memory system, including: a plurality of memory chips, wherein each of the memory chips has a parameter used to characterize a process corner of the memory chip; and a controller, wherein the controller is configured to: obtain the parameter of each of the memory chips, and adjust, based on the parameter, a delay of a read command sent to the memory chip corresponding to the parameter.

BRIEF DESCRIPTION OF THE DRAWINGS

One or more embodiments are exemplified by corresponding accompanying drawings, and these exemplified descriptions do not constitute a limitation on the embodiments. Components with the same reference numerals in the accompanying drawings are denoted as similar components, and the accompanying drawings are not limited by scale unless otherwise specified.

DETAILED DESCRIPTION

Figure 1:
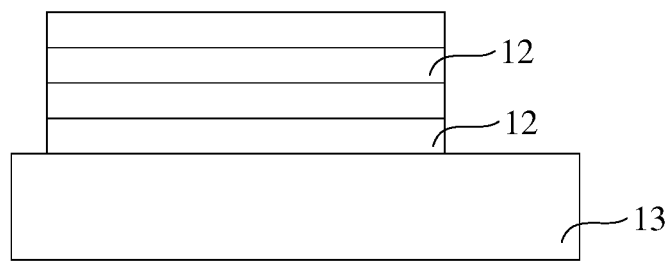
FIG. 1 is a schematic structural diagram of a memory system.
Figure 2:
FIG. 2 is a schematic diagram of data transmission in the memory system according to FIG. 1.
Figure 2:
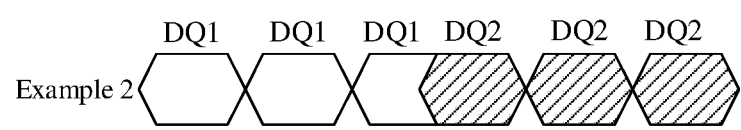

FIG. 1 is a schematic structural diagram of a memory system. FIG. 2 is a schematic diagram of data transmission in the memory system according to FIG. 1. Referring to FIG. 1, the memory system may include: a controller 13; and a plurality of memory chips 12 that are located on a surface of the controller 13 and that are provided in a stacked manner, wherein the memory chip 12 may be a DRAM chip.

Because different memory chips 12 vary in process, electrical properties showed by the different memory chips 12 are also different, for example, threshold voltages or on-currents of transistors in the different memory chips 12 are different, resulting in different delays of data transmission inside the different memory chips 12. This causes data signals received by the controller 13 from the different memory chips 12 to be skewed, levels of different data signals to be inconsistent, the data signals of the different memory chips 12 to have a conflict, and so on, affecting overall performance of the memory system. Specifically, referring to FIG. 2, an example 1 in FIG. 2 is a schematic diagram of ideal transmission of data signals corresponding to two memory chips 12, wherein DQ1 and DQ2 are respectively the data signals that correspond to the different memory chips 12 and that are transmitted to the controller 13; and an example 2 in FIG. 2 is an example diagram of actual transmission of the data signals corresponding to the two memory chips 12, wherein DQ1 corresponds to a memory chip 12 with a slow process corner, and DQ2 corresponds to a memory chip 12 with a fast process corner. In an actual transmission process, data of DQ2 starts to be transmitted before transmission of data of DQ1 is finished. This leads to a data conflict between DQ1 and DQ2, causing storage performance of the memory system to deteriorate.

Based on this, an embodiment of the present disclosure provides a memory system. After the memory system is powered on and started, a controller obtains a parameter that is of the memory chip and that is used to characterize a process corner, and adjusts a delay of a read command based on the parameter, to improve a data conflict problem of the memory system, improve uniformity of alignment of data signals, and further improve read and write performance of the memory system.

In order to make the objectives, technical solutions and advantages of the embodiments of the present disclosure clearer, the embodiments of the present disclosure are described below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 3:
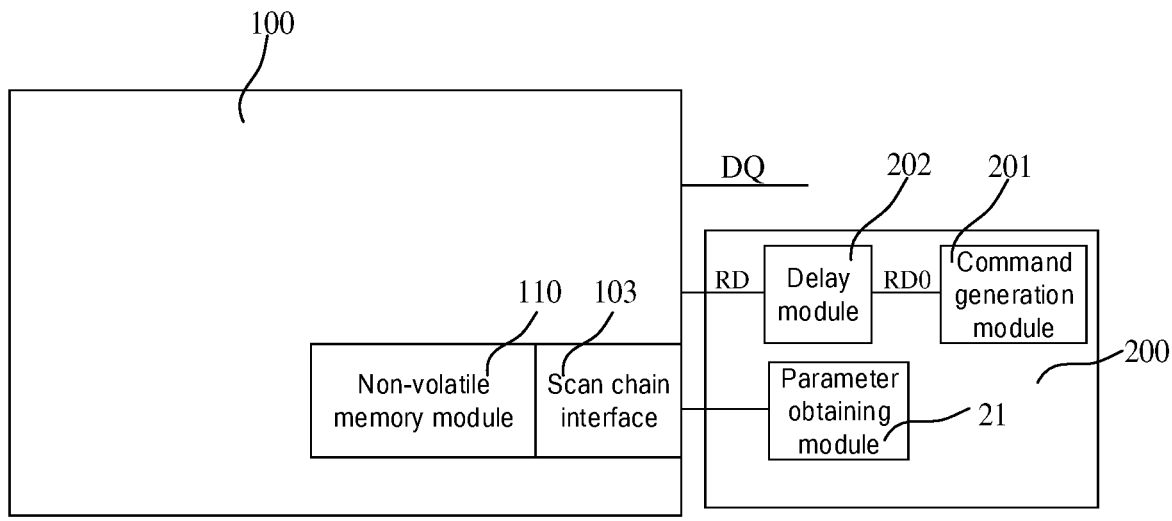
FIG. 3 is a schematic diagram of a functional module of a memory system according to an embodiment of the present disclosure.
Figure 4:
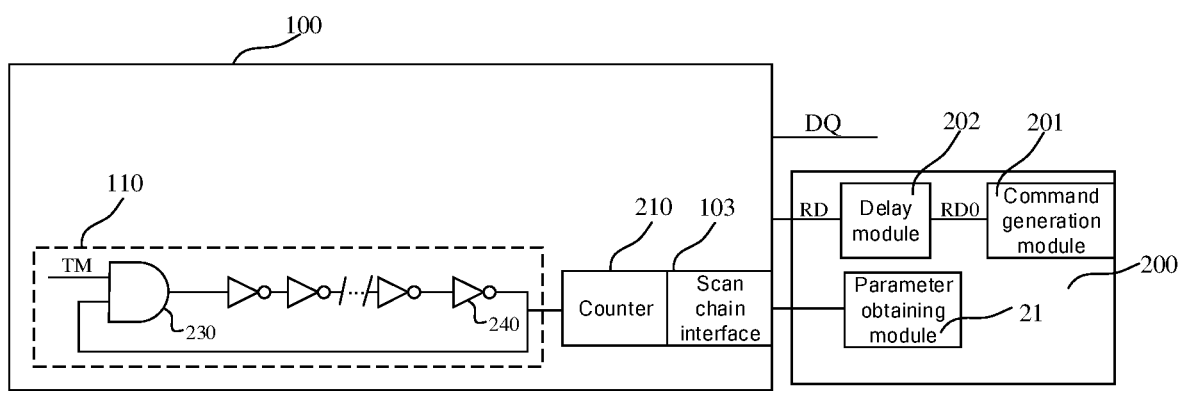
FIG. 4 is a schematic diagram of another functional module of a memory system according to an embodiment of the present disclosure.

FIG. 3 is a schematic diagram of a functional module of a memory system according to an embodiment of the present disclosure. FIG. 4 is a schematic diagram of another functional module of a memory system according to an embodiment of the present disclosure.

Referring to FIG. 3 and FIG. 4, an embodiment of the present disclosure provides a memory system, including: a plurality of memory chips 100, wherein the memory chip 100 has a parameter used to characterize a process corner of the memory chip 100; and a controller 200, wherein the controller 200 is configured to: obtain the parameter of the memory chip 100, and adjust, based on the parameter, a delay of a read command sent to the memory chip 100 corresponding to the parameter.

Different memory chips 100 have a problem of different delays of the chips caused by different process corners, a memory chip 100 with a slow process corner has a larger delay, and a memory chip 100 with a fast process corner has a smaller delay. After receiving the read command RD, the memory chip 100 responds to the read command RD, such that data starts to be read out from the memory cell, and is output to a data port DQ. Therefore, the delay of the read command RD is related to a moment at which the data is read out from the memory cell, and the moment at which the data is read out from the memory cell varies by adjusting the delay of the read command RD to be different, further affecting moments at which data of the different memory chips 100 is output from the data port DQ. Specifically, for a same memory chip 100 or a plurality of memory chips that have a same process corner, the longer the delay of the read command RD, the later the data is read out from the memory cell. In this embodiment of the present disclosure, different parameters correspond to different process corners. Since the delay of the read command RD is adjustable based on the parameter, the delay of the read command RD can be compensated based on the process corner of the memory chip 100, such that consistency between the moments at which the data of the memory chips 100 is read out from the memory cell and are output from the data port DQ is improved.

Specifically, the delay of the read command RD is adjusted, such that a moment at which a corresponding memory chip 100 receives the read command RD varies. In this case, a moment at which data starts to be read out from the memory cell also varies. If the parameter characterizes that the process corner of the memory chip 100 is a slow process corner, the controller 200 controls the delay of the read command RD to be shortened. In this case, a moment at which the memory chip 100 receives the read command RD is earlier, such that the data of the memory chip 100 with the slow process corner can be output from the data port DQ earlier. If the parameter characterizes that the process corner of the memory chip 100 is a fast process corner, the controller 200 controls the delay of the read command RD to be longer. In this case, a moment at which the memory chip 100 receives the read command RD is later, such that the data of the memory chip 100 with the fast process corner can be output from the data port DQ later. In this way, the controller 200 correspondingly compensates delays of read commands RD of the different memory chips 100 based on process corners, such that an actual moment at which data of each memory chip 100 is transmitted to the data port DQ meets an expectation, thereby improving uniformity of data signals, preventing a problem of a data transmission conflict between the different memory chips 100, and improving read and write performance of the memory system.

The memory chip 100 provided in the embodiments of the present disclosure is described in more detail below with reference to the accompanying drawings.

In some embodiments, the memory chip 100 may be a DRAM memory chip, such as a double data rate (DDR) 4 DRAM memory chip or a DDR5 DRAM memory chip. In other embodiments, the memory chip 100 may alternatively be a static random-access memory (SRAM) memory chip, a NAND memory chip, a NOR memory chip, a FeRAM memory chip, or a PcRAM memory chip.

The design of the memory chip 100 needs to meet conditions such as a process corner, a voltage, and a temperature, and a combination formed by the process corner, the voltage, and the temperature is referred to as a process, voltage, and temperature (PVT) condition.

In some embodiments, if a 5-process corner model is adopted, process corners of different memory chips 100 can be classified into a typical NMOS and typical PMOS (TT) process corner, a fast NMOS and fast PMOS (FF) process corner, a slow NMOS and slow PMOS (SS) process corner, a fast NMOS and slow PMOS (FS) process corner, and a slow NMOS and fast PMOS (SF) process corner. Typical means that a drive current is of an average value. Fast means that a drive current is of a maximum value. Slow means that a drive current is of a minimum value (this drive current is an Ids current). This is explained from a measurement point of view. Typical, Fast and Slow are also understood as a speed of carrier mobility, and the carrier mobility refers to an average drift speed of carriers under an action of a unit electric field.

In some embodiments, the parameter may be a characterization parameter stored in the memory chip 100. Because the characterization parameter is prestored into the memory chip 100, when a read command of the memory system needs to be adjusted, the controller 200 may directly obtain the parameter from the memory chip 100, saving a time required by the memory chip 100 to run to obtain the parameter.

TABLE 1

| Process corner | Characterization parameter |
|---|---|
| SS | 01 |
| TT | 00 |
| FF | 10 |

The characterization parameter may be a binary value. In some embodiments, there are three types of process corners. In this case, the characterization parameter and the process corner may have a corresponding relationship as shown in Table 1:

TABLE 2

| Process corner | Characterization parameter |
|---|---|
| SS | 000 |
| TT | 001 |
| SF | 010 |
| FS | 011 |
| FF | 100 |

In other embodiments, there are five types of process corners. In this case, the characterization parameter and the process corner may have a corresponding relationship as shown in Table 2:

Referring to FIG. 3, the memory chip 100 may include a non-volatile memory module 110, and the non-volatile memory module is used to store the characterization parameter. The non-volatile memory module 110 is used to store the characterization parameter, such that even if the memory chip 100 is powered on or off, a capability of storing the characterization parameter by the memory chip 100 remains unchanged.

In some embodiments, the non-volatile memory module 110 may include a one-time programmable (OTP) memory cell. In other embodiments, the non-volatile memory module 110 may alternatively be a programmable read-only memory (PROM) cell or an electrically erasable programmable read-only memory (EEPROM).

It can be understood that, after the memory chip 100 is designed and manufactured, the process corner of the memory chip 100 may be detected, and the characterization parameter of the process corner obtained through the detection may be stored in the non-volatile memory module 110 of the memory chip 100. Specifically, before a memory wafer is cut to obtain discrete memory chips 100, process corners may be detected and characterization parameters may be stored in non-volatile memory modules 110 of the memory chips 100. Alternatively, after a memory wafer is cut to obtain discrete memory chips 100, process corners are detected and characterization parameters are stored in non-volatile memory modules 110 of the memory chips 100.

In some embodiments, referring to FIG. 3, the memory chip 100 may further include a scan chain interface 103, wherein the scan chain interface 103 is configured to: obtain the parameter based on a command signal sent by a controller, and output the parameter to the controller. The controller 200 may further include a parameter obtaining module 21, wherein the parameter obtaining module 21 is configured to: send the command signal to the scan chain interface 103, and receive the parameter output through the scan chain interface 103.

Specifically, the scan chain interface 103 may be used as a medium for transmitting a signal between the controller 200 and the non-volatile memory module 110, and the characterization parameter is transmitted to the controller 200 through the scan chain interface 103. The parameter obtaining module 21 sends the command signal to the scan chain interface 103, the scan chain interface 103 obtains the characterization parameter stored in the non-volatile memory module 110 after receiving the command signal, and then the characterization parameter is transmitted to the parameter obtaining module 21 through the scan chain interface 103.

In some embodiments, the parameter may alternatively be a count value used to characterize the process corner of the memory chip 100, and the memory chip 100 is configured to: each time after the memory system is powered on and started, perform counting within a preset time and obtain the count value. In this way, the non-volatile memory module configured to store the parameter does not need to be provided in the memory chip 100. This is beneficial to reducing an area of the memory chip 100. In addition, the counting is performed after the memory system is powered on and started and the count value is obtained, such that the count value can more closely reflect the process corner of the memory chip 100 in a current period. This is beneficial to improving accuracy of the parameter to characterize the process corner.

Referring to FIG. 4, in some embodiments, the memory chip 100 may include: a ring oscillator 110; and a counter 210, wherein the counter 210 is connected to the ring oscillator 110, and is configured to count an oscillation period of the ring oscillator 110 within a preset time to obtain the count value.

Specifically, an enable signal TM of the ring oscillator 110 may be provided by the controller 200. An oscillation speed of the ring oscillator 110 is related to the process corner of the memory chip 100. If the process corner is a fast process corner, the ring oscillator 110 oscillates faster, or if the process corner is a slow process corner, the ring oscillator 110 oscillates slower. The counter 210 counts the oscillation period of the ring oscillator 110 within the preset time, such that the oscillation speed of the ring oscillator 110 can be reflected through the count value. It may be understood that the preset time may be a range of values, but for different memory chips 100 of a same memory system, the preset time should be a same fixed value to ensure that count values are obtained within a same length of time period.

In other embodiments, the enable signal TM of the ring oscillator 110 may alternatively be provided by the inside of the memory chip 100, for example, that the memory chip 100 is powered on and started may be used as an excitation condition for providing the enable signal TM to the ring oscillator 110.

In some embodiments, the ring oscillator 110 may include: an AND gate 230, wherein one input terminal of the AND gate 230 receives the enable signal TM; and a plurality of cascaded inverters 240 connected in series, wherein an input terminal of the cascaded inverter 240 located at the first position is connected to an output terminal of the AND gate 230, an output terminal of the cascaded inverter 240 at the tail position is connected to the other input terminal of the AND gate 230, and the output terminal of the cascaded inverter 240 at the tail position is further connected to the counter 210. Specifically, if the ring oscillator 110 oscillates once, the counter 210 counts once.

There may be an odd number of cascaded inverters 240.

In some embodiments, the counter 210 may be an addition counter. It should be noted that, the counter 210 may further have a reset terminal, configured to receive a reset signal, wherein the reset signal may be sent out by the controller 200, such that the counter 210 is first reset before performing counting. This ensures that initial values of counters 210 of different memory chips 100 are the same before counting is performed, and may further ensure that a counter 210 of a same memory chip 100 in different test stages has a same initial value before counting is performed.

In some embodiments, the counter 210 may further include a latch module, configured to lock the count value. In this way, after the memory system is powered on and started, the memory chip 100 may first obtain the count value and store the count value, and only after a particular time length, the controller invokes the count value to obtain a process corner of the memory chip 100, to facilitate adjustment of a reference voltage of the memory chip 100. This helps improve testing flexibility of the memory system and allows all memory chips 100 to simultaneously obtain corresponding count values.

Correspondingly, referring to FIG. 4, the memory chip 100 may further include a scan chain interface 103, wherein the scan chain interface 103 is configured to: obtain the count value based on a command signal sent by the controller 200, and output the count value to the controller 200; and the controller 200 further includes a parameter obtaining module 21, wherein the parameter obtaining module 21 is configured to: send the command signal to the scan chain interface 103, and receive the count value output through the scan chain interface 103. Specifically, the parameter obtaining module 21 sends the command signal to the scan chain interface 103, the scan chain interface 103 obtains the count value of the counter 210 after receiving the command signal, and then the count value is transmitted to the parameter obtaining module 21 through the scan chain interface 103.

In some embodiments, the controller 200 may include: a command generation module 201, configured to provide a reference read command RD0; and a delay module 202, configured to: receive the reference read command RD0, and output, based on the parameter, the read command RD that has the delay compared with the reference read command RD0.

Specifically, after obtaining the parameter used to characterize the process corner, the controller 200 outputs, based on the parameter, the read command RD corresponding to the parameter. If the parameter characterizes that the process corner is a fast process corner, a read command RD that has a longer delay compared with the reference read command RD0 is output, to compensate the delay of the read command RD of the memory chip 100, and make up for a problem that a data delay of the memory chip 100 is relatively short due to the fast process corner, such that the memory chip 100 with the fast process corner can receive the read command RD later, and a moment at which the data of the memory chip 100 is transmitted to the data port DQ meets an expectation. If the parameter characterizes that process corner is a slow process corner, a read command RD that has a shorter delay compared with the reference read command RD0 is output, to compensate the delay of the read command of the memory chip 100, and make up for a problem that a data delay of the memory chip 100 is relatively long due to the slow process corner, such that the memory chip 100 with the slow process corner can receive the read command RD earlier, and a moment at which the data of the memory chip 100 is transmitted to the data port DQ meets an expectation.

Figure 5:
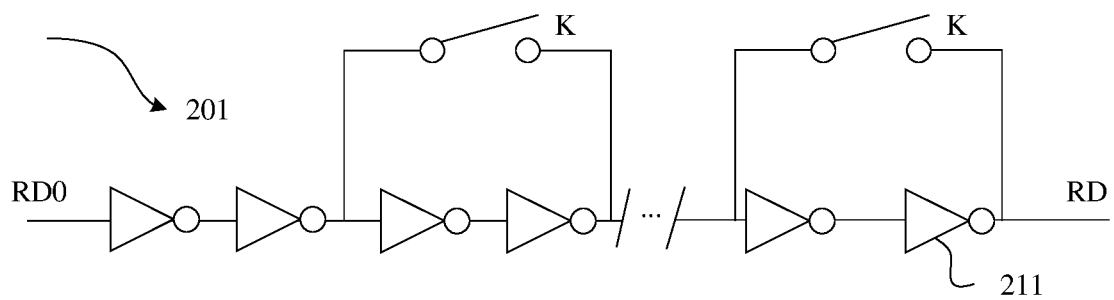
FIG. 5 is a schematic diagram of a circuit structure of a delay module in a memory system according to an embodiment of the present disclosure.

In some embodiments, FIG. 5 is a schematic diagram of a circuit structure of a delay module 201. Referring to FIG. 5, the delay module 201 may include: a plurality of inverters 211 connected in series, wherein the inverter 211 at the first position receives a reference read command RD0, and the inverter 211 at the tail position outputs the read command RD; and a plurality of switches K, wherein each switch K is connected in parallel to at least one inverter 211. In addition, the controller 200 is configured to adjust, based on a parameter, a quantity of switches K that are turned on in the plurality of switches K.

A larger quantity of switches K that are turned on indicates that the read command RD has a shorter delay compared with the reference read command RD0. A smaller quantity of switches K that are turned on indicates that the read command RD has a longer delay compared with the reference read command RD0.

If the parameter characterizes that the process corner is a fast process corner, the quantity of switches K that are turned on is smaller, and the delay of the read command RD is prolong, such that a moment at which data is read out from the memory cell is later, and correspondingly, a moment at which the data is transmitted to the data port DQ after the data is read out from the memory cell is later. If the parameter characterizes that the process corner is a slow process corner, the quantity of switches K that are turned on is larger, and the delay of the read command RD is shortened, such that a moment at which data is read out from the memory cell is earlier, and correspondingly, a moment at which the data is transmitted to the data port after the data is read out from the memory cell is earlier.

The memory system includes the plurality of memory chips 100. Even if a delay from reading out data from a memory cell to outputting the data through a data port DQ is pre-designed for each of different memory chips 100 of the memory system, since the memory chips 100 still have a problem of different process corners, there is still a problem that a data readout delay deviates from that in the pre-design. However, in this embodiment of the present disclosure, the controller 200 further obtains a parameter that is of each memory chip 100 and that can be used to characterize a process corner, and adjusts, according to the parameter corresponding to the process corner, a delay of a read command RD for controlling the memory chip 100 to read out data, that is, the delay of the read command RD is compensated according to the process corner, to adjust actual moments at which the data of the memory chip 100 is read out from the memory cell and transmitted to the data port DQ, such that the actual moment at which the data of each memory chip 100 arrives at the data port DQ confirms to that in the pre-design, thereby preventing a problem of a conflict between data transmission corresponding to the different memory chips 100, and improving storage performance of the memory system.

Using the plurality of inverters 211 connected in sequence to form the delay module 201 can not only realize a function of obtaining different delays of the read command RD, but also enable the delay module 201 to have a simple circuit structure and occupy a small space of a chip area of the controller 200. This is beneficial to reducing the design difficulty of the controller 200 and reducing the chip area.

It may be understood that, in another embodiment, another proper delay circuit may alternatively be used as the delay module.

It should be noted that, in some embodiments, sizes of the inverters 211 may be the same, and delay characteristics of the inverters 211 may be the same; and in other embodiments, sizes of the inverters 211 may alternatively be different, and the inverters 211 have different delay characteristics.

In some embodiments, an even number of the inverters 211 in the delay module 201 may be used, and the switches K is connected in parallel to an even number of the inverters. In this way, the read command RD and the reference read command RD0 have a same phase.

In some embodiments, the controller 200 is configured to: each time after the memory system is powered on and started, obtain the parameter of the memory chip 100, and adjust the delay of the read command RD sent to the memory chip 100 corresponding to the parameter, until parameters of all of the memory chips 100 are obtained through polling and delays of read commands RD sent to all of the memory chips 100 are adjusted.

In some specific examples, a required delay that is of a read command RD and that corresponds to each memory chip 100 may be locked and recorded, for example, information that is about a quantity of switches K needing to be controlled to be turned on and that corresponds to each memory chip 100 is recorded; afterwards, in a period in which the read command RD is delivered again, data is sent to a corresponding memory chip 100 by using the required delay that is of the read command RD and that is recorded before, for example, for the different memory chips 100, the quantity of switches K that are recorded to be turned on is enabled.

In other specific examples, the controller 200 may further include a plurality of delay modules, wherein the delay modules may send read commands RD that have different delays to the memory chip 100. After the memory system is powered on and started, each delay module records a delay that a read command RD sent to the memory chip 100 has. In addition, after delays of read commands RD sent to all memory chips 100 are adjusted, each delay of a corresponding read command RD is recorded by a corresponding delay module. Afterwards, a different delay module is enabled to send a read command RD to a corresponding memory chip 100, such that a delay of the read command RD sent to the memory chip 100 meets a requirement. In this way, there is no need to perform adjustment each time before delivering the read command RD. This is beneficial to reducing power consumption of the memory system, and improving a storage speed of the memory system. Specifically, in some embodiments, referring to FIG. 4, after the memory system is powered on and started, an enable signal TM is first sent out to the memory chip 100 through the controller 200, such that the ring oscillator 110 starts to oscillate, and the counter 210 counts an oscillation period within a preset time, to obtain a count value, wherein the count value is used as a parameter for characterizing the process corner.

In some embodiments, referring to FIG. 3, the controller 200 obtains a characterization parameter from the non-volatile memory module, wherein the characterization parameter is used as a parameter for characterizing the process corner.

The working principle of the controller 200 is described in more detail below.

In an example, the controller 200 may adjust the delay of the read command RD of the memory chip 100 in the following manner: performing a read and write operation test, obtaining a delay from sending out a reference read command to outputting data from the data port, and obtaining a memory chip 100 whose delay does not meet an expectation; obtaining a parameter value of the memory chip 100 whose delay does not meet the expectation by using a memory chip 100 whose delay meets the expectation as a standard or by using a memory chip 100 with a standard process corner as a standard, and adjusting a quantity and/or positions of switches K that are turned on; and performing the read and write operation test on the adjusted memory chip 100 again, and if a data delay still does not meet a requirement, continuing to adjust the quantity and/or positions of switches K that are turned on, until data of the adjusted memory chip 100 meets the requirement. It may be understood that, the delay from sending out the reference read command to reading out data from the data port includes the following two segments of delays: a delay from sending out the reference read command to starting to read out the data from the memory cell; and a delay from reading out the data from the memory cell to outputting the data from the data port DQ.

In a specific example, after the memory system is powered on and started and before the read and write operation test is performed, ring oscillators 110 and counters 210 of all memory chips 100 may all start to work, to obtain and store corresponding count values; and after the first time of read and write operation test is performed, the controller 200 obtains a count value of a memory chip 100 whose delay does not meet the expectation. This is beneficial to shortening a time required for the overall test of the memory system.

In another specific example, after the memory system is powered on and started and the first time of read and write test is performed, only a ring oscillator 110 and a counter 210 of a memory chip 100 whose delay does not meet the expectation start to work, to obtain a corresponding count value and send the count value to the controller 200. In this way, counting is performed only for the memory chip 100 whose delay does not meet the expectation. This is beneficial to reducing power consumption of the memory system.

Figure 6:
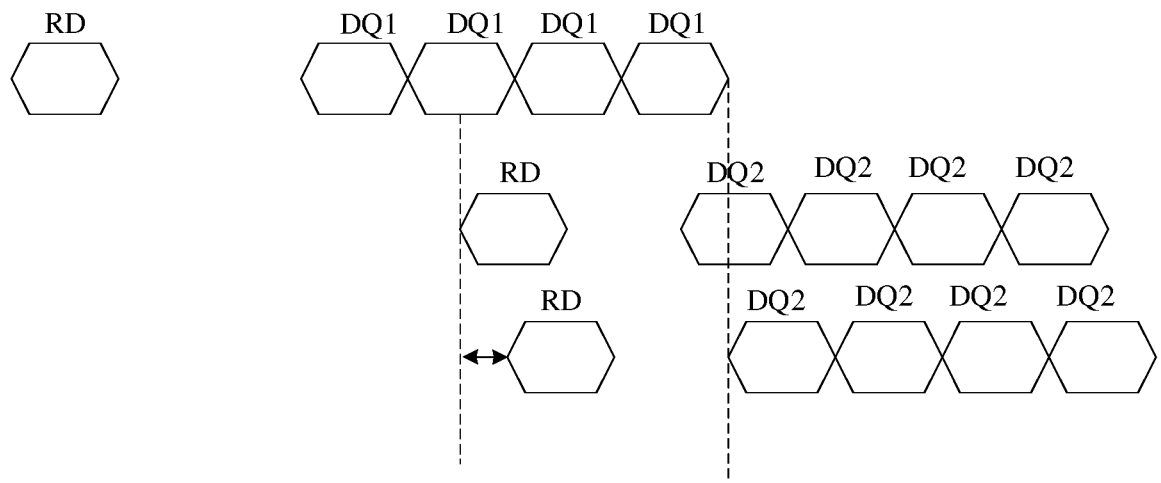
FIG. 6 is a timing diagram of read commands and data that correspond to different memory chips in a memory system.

As shown in FIG. 6, the first row in FIG. 6 is a timing diagram of a read command RD and data DQ1 of a memory chip 100, and both the second row and the third row is a timing diagram of a read command RD and data DQ2 of another memory chip 100, wherein the second row is a corresponding timing diagram before a delay of the read command RD of the memory chip 100 is adjusted, and the third row is a corresponding timing diagram after the delay of the read command RD of the memory chip 100 is adjusted. It is learned from FIG. 6 that, for the another memory chip 100, if the delay of the read command RD is not adjusted, a conflict problem between data transmission of different memory chips 100 occurs, and after the delay of the read command RD of the memory chip 100 is adjusted, the conflict problem between data of the different memory chips 100 is resolved.

Figure 7:
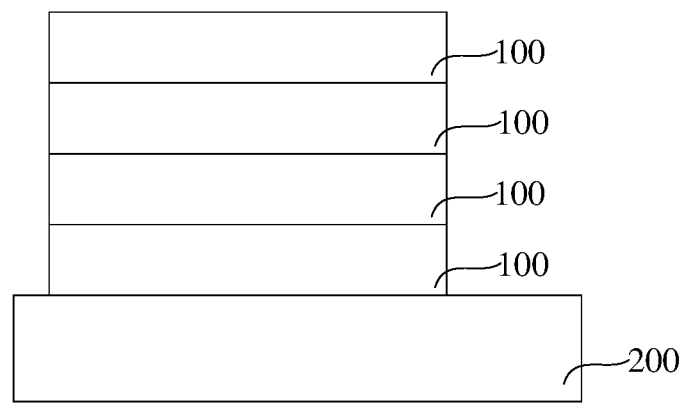
FIG. 7 is a schematic structural diagram of a memory system according to an embodiment of the present disclosure.
Figure 8:
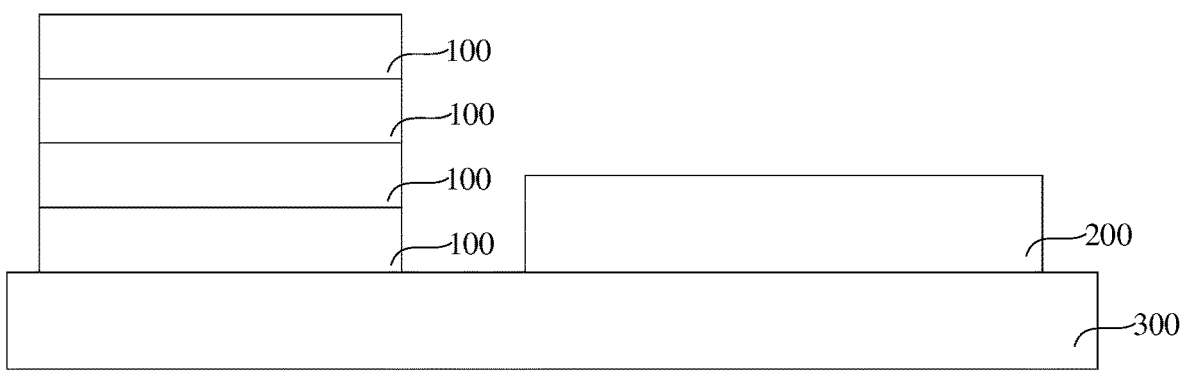
FIG. 8 is another schematic structural diagram of a memory system according to an embodiment of the present disclosure.

As shown in FIG. 7, in some embodiments, a plurality of memory chips 100 are sequentially stacked on a surface of the controller 200, and the memory system is a 3D stacked structure. FIG. 8 is another schematic structural diagram of a memory system according to an embodiment of the present disclosure. In other embodiments, as shown in FIG. 8, the memory system may further include: a carrier substrate 300, wherein the controller 200 is located on a surface of the carrier substrate 300, a plurality of memory chips 100 are sequentially stacked on the surface of the carrier substrate 300, and the memory system forms a 2.5 D stacked structure.

The embodiments of the present disclosure provide a memory system with a superior structure and performance, wherein a delay of a read command RD for controlling a data transmission delay can be adjusted according to a process corner of a memory chip 100, such that a moment at which data of each memory chip 100 is output from a data port DQ meets an expectation, thereby improving read and write performance of the memory system.

The technical solutions provided in the embodiments of the present disclosure have the following advantages:

In the technical solutions of the memory system provided in the embodiments of the present disclosure, each of the memory chips has a parameter used to characterize a process corner of the memory chip, and the controller is configured to: obtain the parameter of each of the memory chips, and adjust, based on the parameter, a delay of a read command sent to the memory chip corresponding to the parameter. In this way, the delay of the read command sent to each memory chip can be differently compensated based on the process corner, to make up for a problem that data transmission of the memory chip is slower due to a slow process corner, and make up for a problem that data transmission of the memory chip is faster due to a fast process corner, such that moments at which data of memory chips with different process corners is output through a data port meet expectations, thereby improving data uniformity, preventing a data transmission conflict between the different memory chips from occurring, and improving storage performance of the memory system.

Those of ordinary skill in the art can understand that the foregoing implementations are specific embodiments for implementing the present disclosure. During actual application, various changes may be made to the foregoing embodiments in terms of form and details without departing from the spirit and scope of the present disclosure. Any person skilled in the art may make changes and modifications without departing from the spirit and scope of the present disclosure. Therefore, the protection scope of the present disclosure should be subject to the scope defined by the claims.

What is claimed is:

1. A memory system, comprising:
   a plurality of memory chips, wherein each of the memory chips has a parameter used to characterize a process corner of the memory chip; and
   a controller, wherein the controller is configured to obtain the parameter of each of the memory chips, and adjust, based on the parameter, a delay of a read command sent to the memory chip corresponding to the parameter.

2. The memory system according to claim 1, wherein the parameter is a characterization parameter stored in the memory chip.

3. The memory system according to claim 2, wherein the memory chip comprises a non-volatile memory module; and the memory chip is configured to: before being packaged with the controller, obtain the characterization parameter and store the characterization parameter into the non-volatile memory module.

4. The memory system according to claim 3, wherein the non-volatile memory module comprises a one-time programmable memory cell.

5. The memory system according to claim 1, wherein the parameter is a count value used to characterize the process corner of the memory chip, and the memory chip is configured to: each time after the memory system is powered on and started, perform counting within a preset time and obtain the count value.

6. The memory system according to claim 5, wherein the memory chip comprises:
   a ring oscillator; and
   a counter, wherein the counter is connected to the ring oscillator, and is configured to count an oscillation period of the ring oscillator within the preset time to obtain the count value; and
   the controller is connected to the ring oscillator and the counter, and is configured to control the ring oscillator to start to oscillate and obtain the count value.

7. The memory system according to claim 6, wherein an enable signal of the ring oscillator is provided by the controller.

8. The memory system according to claim 1, wherein the controller comprises:
   a command generation module, configured to provide a reference read command; and
   a delay module, configured to receive the reference read command, and output, based on the parameter, the read command that has the delay compared with the reference read command.

9. The memory system according to claim 8, wherein the delay module comprises:
   a plurality of inverters connected in series, wherein the inverter at the first position receives the reference read command, and the inverter at the tail position outputs the read command; and
   a plurality of switches, wherein each of the switches is connected in parallel to at least one of the inverters, and the controller is configured to control, based on the parameter, a quantity of switches that are turned on in the plurality of switches.

10. The memory system according to claim 9, wherein an even number of the inverters are used.

11. The memory system according to claim 9, wherein each of the switches is connected in parallel to an even number of the inverters.

12. The memory system according to claim 1, wherein the controller is configured to: each time after the memory system is powered on and started, obtain the parameter of each of the memory chips, and adjust the delay of the read command sent to the memory chip corresponding to the parameter, until parameters of all of the memory chips are obtained through polling and delays of read commands sent to all of the memory chips are adjusted.

13. The memory system according to claim 1, wherein the memory chip further comprises a scan chain interface, wherein the scan chain interface is configured to obtain the parameter based on a command signal sent by the controller, and output the parameter to the controller; and the controller further comprises:
   an obtaining module, wherein the obtaining module is configured to send the command signal to the scan chain interface, and receive the parameter output through the scan chain interface.

14. The memory system according to claim 1, wherein the plurality of memory chips are sequentially stacked on a surface of the controller.

15. The memory system according to claim 1, wherein the memory system further comprises a carrier substrate, wherein the controller is located on a surface of the carrier substrate, and the plurality of memory chips are sequentially stacked on the surface of the carrier substrate.

* * * * *